United States Patent [19]

West et al.

[11] Patent Number: 4,956,817
[45] Date of Patent: Sep. 11, 1990

[54] HIGH DENSITY DATA STORAGE AND RETRIEVAL SYSTEM

[75] Inventors: Paul E. West, Glendale; Jamshid Jahanmir, Pomona, both of Calif.

[73] Assignee: QuanScan, Inc., Pasadena, Calif.

[21] Appl. No.: 199,008

[22] Filed: May 26, 1988

[51] Int. Cl.$^5$ .............................................. G11C 13/00
[52] U.S. Cl. ................... 365/189.01; 365/182; 365/203
[58] Field of Search ............... 365/189.01, 185, 182, 365/203; 307/530

[56] References Cited

U.S. PATENT DOCUMENTS

| | | |
|---|---|---|
| 3,072,543 | 1/1963 | Lubow et al. . |
| 3,761,895 | 9/1973 | Ellis et al. . |
| 3,920,930 | 11/1975 | Sobczyk . |
| 4,106,107 | 8/1978 | Goodman . |
| 4,340,953 | 7/1982 | Iwamura et al. . |
| 4,343,993 | 8/1982 | Binnig et al. . |
| 4,575,822 | 3/1986 | Quate . |

Primary Examiner—Terrell W. Fears
Attorney, Agent, or Firm—Fulwider, Patton, Lee & Utecht

[57] ABSTRACT

A high density computer memory which utilizes a probe operating with two degrees of freedom over a memory area, the probe location altered by drive systems incorporating piezoelectric elements arranged to drive the probe parallel to the plane of the memory surface. Sensors to provide an indication of the location of the probe independent of the drive system are provided. The memory system incorporates an underlying substrate upon which is deposited one of a variety of elements or compounds chosen to effect a change in physical-chemical properties when a data bit is written on the surface. The probe is moved over the surface at a distance which produces a current from Schottky or Field effect.

33 Claims, 5 Drawing Sheets

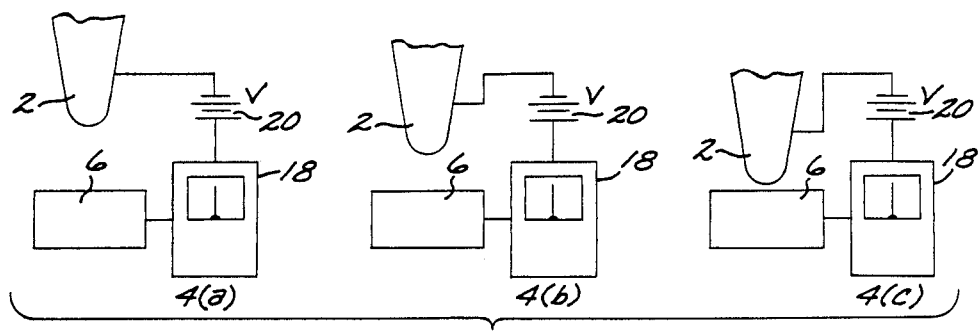
FIG. 4
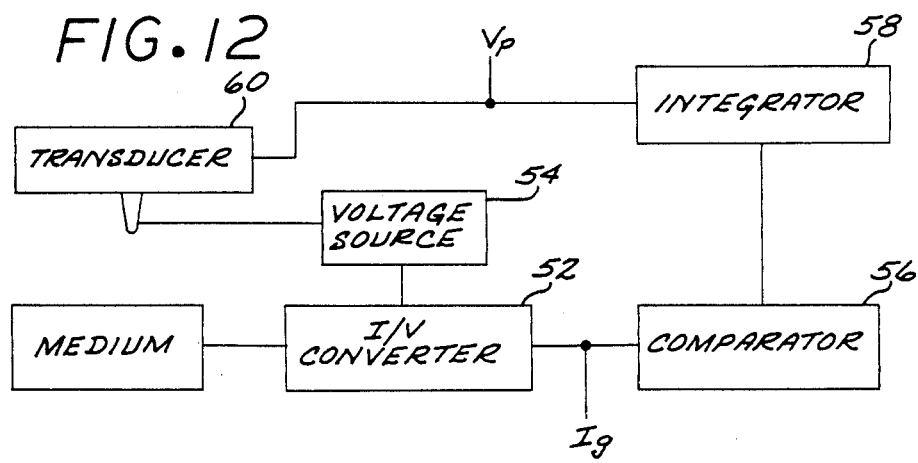
FIG. 12
FIG. 13
FIG. 14
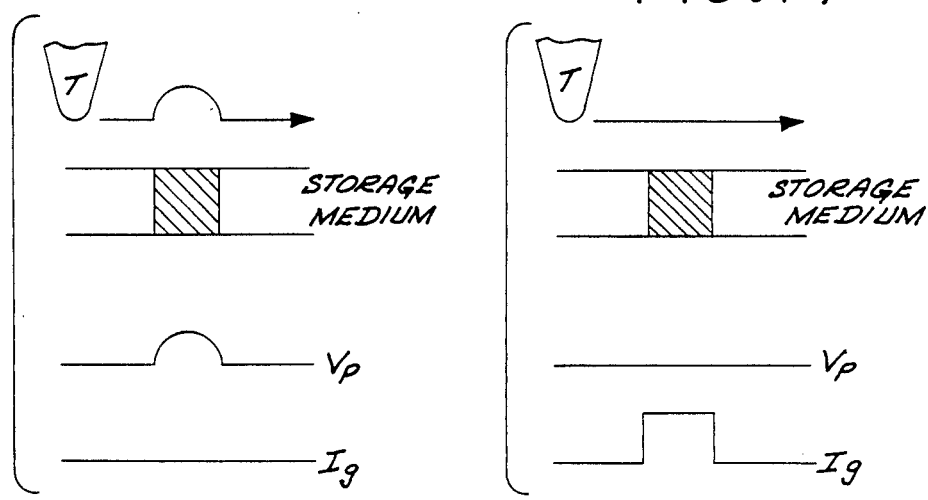

HIGH DENSITY DATA STORAGE AND RETRIEVAL SYSTEM

BACKGROUND OF THE INVENTION

1. Field of the Invention

This invention relates to memory storage media for use with computers, and more specifically to ultra high density memories for use with general purpose digital computers.

2. Description of the Related Art

The widespread use of computers to perform analysis of data and maintain data bases has caused an ever increasing need for rapid storage and access of large quantities of such data. A wide variety of data storage memory devices have been developed. Among the first of such memories were relatively simple arrays of discrete magnetic elements, such as magnetic core memories. Later, a variety of active and semiactive devices, such as semiconductor memories consisting of arrays of flip-flop circuits or electrical charge coupled devices (CCDs), were developed and continue to be used in a wide variety of computers today.

An accelerating need for massive memory for a number of computer applications has led to the development of optical storage media and other advanced memory concepts that provide very high storage densities per square centimeter of active area in Write Once Read Many (WORM) memories. All of these schemes have had benefits and disadvantages that made them effective for certain applications and less effective for other applications. However, to date, no single data storage and readout memory device has demonstrated all of the important characteristics of an ideal storage medium, since they all include operational limitations in some combination of storage size, density, accuracy or access speed.

One important characteristic of such data storage systems is the access time required to retrieve or store a block of information in a storage system comprised of a large amount of digital information. A requirement to randomly access such data, an important feature for many computer applications, places further constraints upon the types of systems and mechanisms of storage and retrieval of the data in such memories. Long access times substantially diminish the benefits that might otherwise be available from a storage medium that provides large storage capacities.

From the above, it may be seen that high density data storage is only meaningful and useful in a computer system if it is combined with reasonable random access times, accuracy in locating and reading out the data and construction requirements that are likely to result in a relatively robust and easily fabricated memory system.

One approach proposed to achieve high density data storage systems has been based upon the concept of the scanning tunneling microscope as originally conceived by Gerard Binning. One such proposal by Calvin Quate, as reflected in U.S. Pat. No. 4,575,822, describes the use of the tunneling current effect in combination with a dielectric layered storage medium. However, such proposals, which rely upon the tunneling currents present when a stylus is placed within approximately 10 angstroms of a surface and voltage is applied to the stylus and media over which it is moved, result in data storage systems that are not practical for a system requiring access times useful in any realistic computer memory system.

Such systems also present severe control and indexing problems, since the clearance between the stylus and the storage medium must be maintained to extremely close tolerances, on the order of a few angstroms (Å), if tunneling currents with reasonable dynamic ranges are to be maintained. These requirements place severe operational constraints on the quality of construction of the device, the dynamic range and accuracy of the stylus drive system and the quality of the ambient environment maintained in the memory if acceptable performance is to be obtained. Even under the most favorable of operational environments, the proposal to use tunnelling current techniques for high density data storage contains many difficulties related to fabrication, thermal control, environmental control and access times.

Therefore, there still exists a need for extremely high density data storage systems that will provide rapid, random access for storage and retrieval of data and may be constructed without the use of exotic materials or manufacturing techniques. Furthermore, it would be extremely beneficial if such a device, unlike proposed storage devices utilizing tunneling currents, could be constructed so that they could be operated in air rather than in the vacuum or another highly controlled environment required for devices using tunneling currents.

SUMMARY OF THE INVENTION

High density data storage media and apparatus are of limited benefit for many computer applications unless rapid, random access to the writing and reading of such data is provided. Furthermore, the benefits of a high density storage system which cannot be fabricated in a relatively robust package are extremely limited, especially for military and aerospace applications. Thus, a high density data storage system that is relatively rugged and easily constructed, utilizing readily available technology, represents a substantial improvement over many current data storage systems that either, on the one hand, provide relatively low storage densities with rapid access or on the other hand, provide relatively high storage densities but slow access, often coupled with delicate difficult construction. These latter limitations are particularly evident if a storage medium of the type utilizing the tunneling current effect is contemplated.

An effective memory system for modern general purpose digital computer applications should be able to store a large quantity of digital information, generally in binary form, and provide random access to the data, indexed to a location within the memory, with rapid, accurate readout. It is desirable that the memory be robust, not easily effected by the environment, whether it be climate or electromagnetic, and should be relatively easily constructed using available manufacturing techniques. Furthermore, it would be advantageous if the storage medium for the memory was compact, consumed a relatively low amount of power and could be configured so that the data was recorded and read with high reliability. A further function that has assumed increased importance as computer systems capable of utilizing very large data bases has been developed is that of high speed access, and a system that combined the above features with high speed access to the data would provide many benefits over existing systems.

The present invention provides the benefits of high density digital data storage within a robust, simple and easily constructed device while also providing rapid access and accurate indexing of data to be stored or retrieved. The invention is based upon the use of a concept, that eliminates the serious limitations of a memory that is based on the use of tunneling currents, to record and read data stored as disturbances in the interface between semiconductor layers of a planar body used as a memory. If the tunneling current effect is used, then the probe must be placed closer than twenty angstroms (20Å) to the surface of the memory surface. Since, in practice, it is virtually impossible to fabricate a surface over a large enough area to constitute a practical device that is smoother than 5 to 10 angstroms peak to peak surface roughness, this means that the probe must be accurately driven in three dimensions to track the surface irregularities with sufficient accuracy to preserve the relationship of the probe with the local surface and thereby provide consistent readout of data utilizing the tunneling effect. Such precision in maintaining the distance between the driven probe and the local surface is also required to preserve the dynamic range required for readout if tunneling currents are to be used.

Furthermore, no effective means of indexing the position of the probe to the data has been suggested in previous proposals, and without such an indexing system, fabrication of an effective memory system is extremely difficult. When the fact that tunneling currents only exist if the probe is within 20Å of the surface is considered, it is evident that the tunneling current concept for a mass storage implies many limitations, if it is operative at all.

Additionally, The extreme smoothness required of the surface of the memory if tunneling currents are to be used requires that great effort must be made to prevent contamination of the surface with particles present in the atmosphere or outgassed from other parts of the system. Since a single atom of a variety of elements and compounds is a number of angstroms in diameter, the seriousness of the contamination problem for a device using the tunneling current concept is obvious.

The present invention largely eliminates these problems by use of a concept different from tunneling as a readout method, development of a simple but effective method of indexing the readout system within the memory and development of a memory material construction that provides significant and unexpected benefits over those used in other memory systems.

It has been found that the transfer of electrons from a probing tip to an underlying surface can occur by one of several types of electron transfer mechanisms, including tunnel emission, Field emission and Schottky emission. This fact has been used in the development of a variety of semiconductors and other electronic devices (e.g., Schottky Diodes, tunnel diodes). For each of these electron transfer mechanisms, a larger current is observed as the tip is brought closer to the surface when a voltage is supplied between the tip of the probe and the surface. However, for the tunneling effect to occur and produce measurable currents, the probe must be brought extremely close to the surface, normally less than 20 angstroms.

The electron transfer mechanism that describes the transfer of electrons to the tip from a surface depends on several parameters, including the temperature of the tip and the surface, the composition of the gaseous material, if any, between the tip and the surface and the chemical composition of the tip and the surface. Tunneling emission will generally not exist if the gap is greater than approximately 10 angstroms and the effect disappears almost entirely at 20 angstroms. By contrast, Field emission and Schottky emission can provide useful variations in currents sensed acrossed a gap for distances from 50 to 1,000 angstroms. This discovery has an important benefits; the roughness of the underlying memory surface need not be accurately tracked by the probe in order to maintain the appropriate distance to perform readout.

Thus, the probe in the present invention, which typically is in the form of a protrusion extending from a readout head being moved over an underlying memory surface, can be moved in two dimensions over the surface and can maintain a constant height above the average height of the underlying surface. If necessary, a slight amount of vertical movement to accommodate slopes in the memory surface or changes occurring from variations in temperature may be accommodated in the readout head, but it is unnecessary that the readout head of the present invention employ a vertical drive system to track the roughness of the memory surface.

The present invention also employs a means of locating and indexing the readout head relative to a location on the memory surface. Without such a locating and indexing means, the memory itself must be used as a locating system with a subsequent decrease in the reliability of readout of the memory system, since any error in memory location during a readout would not provide a back-up indication of the source of the error. The present invention utilizes a moving sensor associated with each axis of the readout head which scans across a grating located on orthogonal edges of the memory surface or on the memory surface itself. In practice, the grating will consist of alternating insulating and conducting lines over which a sensor scans. The output of the sensor scanning of the grating is entered into a counter to provide an accurate indication of location relative to an index position for the probe. It has been found that gratings may be constructed which provide a resolution of less than 0.06 microns. This resolution is sufficient to locate relatively small areas of memory from which exact locations of bits may be easily derived.

An important benefit of using Schottky or Field emission for readout results from the fact that the gap resistance in the Schottky emission mode can be approximately $10^5$ Ohms for distances as large as 500 Å. By contrast, in the tunneling mode, the gap resistance is generally on the order of $10^7$ Ohms for distances of 10-15 Å and thus, with equivalent other tip electrical factors, the bit transfer rate for the tunneling mode will be on the order of 100 times slower than that achievable with Schottky emission. Thus, the present invention provides, in addition to the other benefits described above, a bit transfer rate approximately 100 times faster than that achievable with tunneling emission.

Another feature of the present invention involves the use of a novel memory material that provides certain important benefits compared to previously proposed memory system constructions. The present invention utilizes an underlying surface such as doped-silicon or any of a variety of other conductive crystaline structural materials upon which is deposited a thin layer of one of a family of materials generally characterized by positions in the periodic table represented by transition metals, posttransition metals, the lanthanide series, the actinide series and certain compounds of these elements. Examples of such materials that have been successful utilized include platinum, gold and paladium.

It has been found that when the probe is placed over a location in the memory material in which data is to be stored in the form of a positive indication that data are present, typically equivalent to the digital form 1, placing a voltage of a sufficient level between the probe and the memory material results in a localized modification of the material characteristics at its surface. This modification takes the form of a physical-chemical transformation in which the underlying substrate of silicon or similar material migrates into the surface of gold or similar material, thereby causing a local alteration in the conductive properties of the memory material.

Thereafter, readout of the digital state of this location is based upon the variation in current present when the probe is moved over this area in the presence of a constant voltage bias between the probe and the memory material.

In practice, the invention operates by causing a perturbation in the memory surface which results in a change in the local resistance to the passage of electrons from the storage material surface to the probe. The probe is then moved in a plane parallel to the surface of the memory material at a distance of 50–1000 angstroms. Means for indexing in the form of a grating and associated sensor for readout thereof, combined with a counter system, is provided on orthogonal edges or on the surface of the memory medium to thereby locate the position of the probe on the memory surface. The entire device may be constructed of readily available materials using known construction techniques and it is unnecessary for the memory system to operate in a vacuum or a highly controlled environment. The use of Schottky emission or Field emission results in a device with a readout speed capability two orders of magnitude greater than if tunneling is used and the elimination of the requirement to accurately track the surface to within a few angstroms dramatically reduces the complexity and performance requirements of the probe control system and electronics, and improves the ruggedness and reliability of the entire memory system.

Other features and advantages of the present invention will become apparent from the following detailed description, taken in conjunction with the accompanying drawings, which, illustrate by way of example, the principles of the invention.

BRIEF DESCRIPTION OF THE DRAWINGS

FIG. 4 illustrates the probe to memory surface distance for a constant current for Schottky, Field and tunneling emission.

FIG. 12 is a simplified schematic of the readout system to determine the binary state of a location on the memory medium of the present invention.

FIG. 13 is an illustration of the mechanism of readout when a tip and constant current are used to detect a perturbation in the storage medium.

FIG. 14 is an illustration of the mechanism of readout when a tip and constant voltage are used to detect a perturbation in the storage medium.

DESCRIPTION OF A PREFERRED EMBODIMENT

The present invention is embodied in a probe which utilizes an electron transfer mechanism, such as Schottky emission or Field emission, to detect perturbations in a memory surface over which the probe is moved. Since the probe may be positioned many orders of magnitude greater than the surface roughness of the memory material away from the memory material, the probe need only be capable of movement with two degrees of freedom and an indexing means is provided on the orthogonal axes of the memory medium to provide an accurate index of the position of the probe over the memory medium. The memory medium incorporates a thin layer of platinum, gold or other transition metal deposited upon an underlying substrate of silicon or other suitable semi-conductor. Data are recorded on the medium by placing a probe close to the surface and causing a relatively large voltage to exist between the probe and the surface, thereby creating a local physical-chemical change in the memory in which the underlying substrate migrates into the overlying surface to thereby cause a perturbation in the conductivity of the surface. The present invention provides a means of storing enormous quantities of data within a very small area of a memory while still providing a robust and easily fabricated memory storage system that allows random and rapid access to data stored in the memory.

Figure 1:
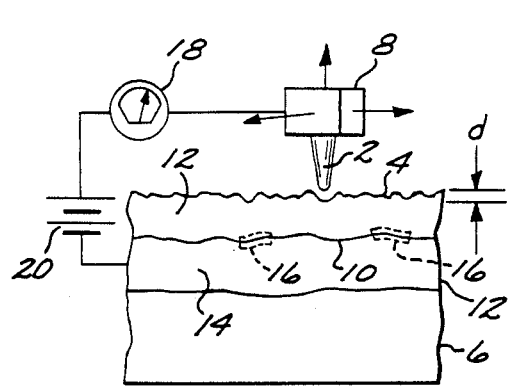
FIG. 1 is an illustration of the prior art illustrating a probe utilizing tunneling currents moving over a semiconductor substrate.

Memory storage devices have been proposed which utilize tunneling currents as a means of reading out perturbations in layers of a substrate located beneath a probe. FIG. 1 illustrates in a diagrammatic fashion the relationship between a probe and an underlying substrate according to the prior art. The probe 2 is positioned a distance d from the upper surface 4 of memory substrate 6 and is moved by means of piezoelectric drives with three degrees of freedom over the surface in order to maintain a distance required to create tunneling emission and cause tunneling currents to flow between substrate 6 and probe 2. This means that probe head 8 must be driven with great accuracy in all three degrees of freedom in order to prevent probe 2 from contacting surface 4, which typically has an RMS roughness on the order of 15Å if it is carefully constructed with the best available techniques. Alterations in the surface interface 10 between semiconductor layers 12 and 14 are in the form of charges 16 deposited at those interfaces by activation from an external probe when in a read-in mode. Ammeter 18 provides an indication of tunneling current when a constant voltage from voltage source 20 is applied across tip 2 and memory substrate 6.

Figure 2:
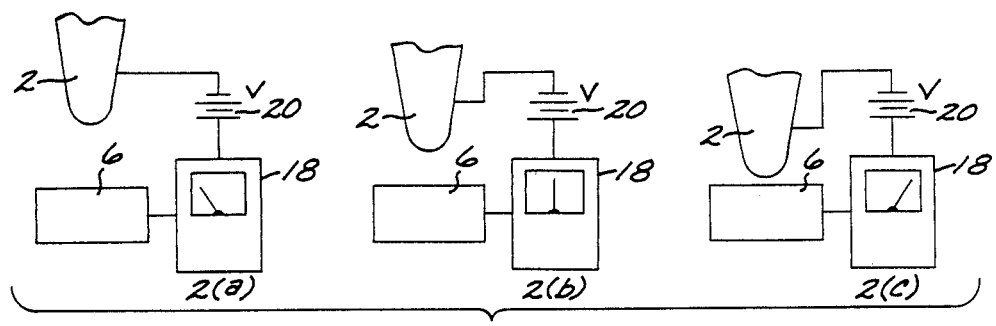
FIG. 2 illustrates the variation in current as a probe is moved virtually relative to an underlying surface.

If a probe is moved toward a surface while a constant voltage is applied between the probe and the surface, the current will increase as the probe gets closer to the surface. FIG. 2(c) illustrates how, in the general case, the ammeter 18 indicates an increase in current for a constant voltage from voltage source 20 as probe 2 is moved closer to underlying surface 6. Such an effect occurs as a probe is moved towards a surface, provided that the type of emission remains the same.

Figure 3:
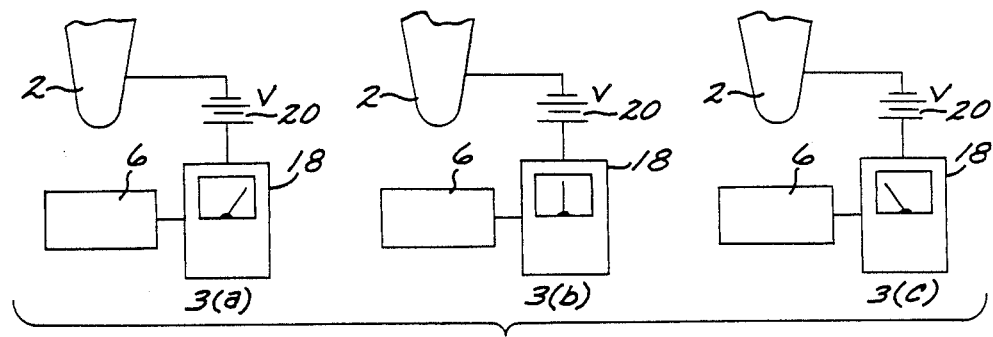
FIG. 3 illustrates the relationship between Schottky, Field and tunneling emission currents for a constant probe distance.

FIG. 3 illustrates that the type of emission does not, however, remain the same for a constant voltage source between the probe and an underlying surface. Depending upon the type of emission for a given distance from the probe, the amount of current which flows may be dramatically different. For instance, in FIG. 3(a) the probe is located approximately 500Å from the surface and Schottky emission occurs, with the ammeter indicating that a strong current, on the order of mircroamps, flows. FIG. 3(b) illustrates a lower current flow which could be expected at the same distance when Field emission occurs and a constant voltage is applied from voltage source 20. FIG. 3(c) illustrates that there is virtually no current flow due to tunneling emission when the probe is positioned 500Å from the underlying surface with a constant voltage applied from voltage source 20. Thus, the contribution of these three emission mechanisms to current flow alters dramatically as a function of the distance of the probe from the surface.

FIG. 4 illustrates that the same currents may be generated from Schottky emissions with the probe located 500Å from the surface as shown in 4(a) as is generated from Field emission with the probe located 50Å from the surface as illustrated in FIG. 4(b). As shown in FIG. 4(c), an equivalent current may be generated from tunneling emission when the probe is placed 10Å from the surface.

From the above it may be seen that emission between a probe and an underlying surface spaced apart from the probe is a multiparameter problem involving complex quantum mechanics issues. The use of geometrics that utilize Schottky, Field effect and other emissions that are present at distances from about 20 angstroms to about 1000 angstroms present large and important benefits compared to the use of distances which propogate current varying the tunneling effect. The result is that the present invention produces a superior apparatus and method for storage and retrieval of data with ultra high density.

Figure 5:
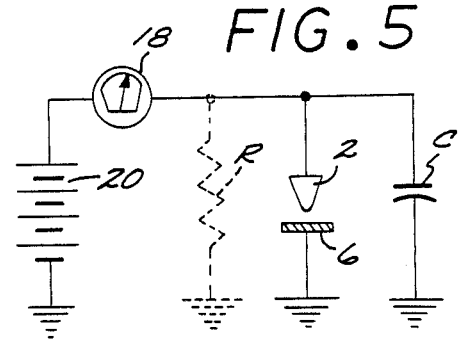
FIG. 5 is a schematic illustration of the effective circuit of a probe in proximity with a surface when a voltage is applied across the probe and surface.

FIG. 5 illustrates a schematic equivalent to a probe 2 in close proximity to an underlying surface 6 of the type discussed above. The proximity of probe 2, the read/write tip-to-surface 6 presents an equivalent resistance R and capacitance C which in the presence of ammeter 18 and voltage source 20 completes an equivalent R-C network. A practical mass storage memory device should have readout times, or equivalent transfer rates, of a single bit of approximately 0.1 microsecond or less. If the capacitance of the read/write tip is typically one picofarad ($1 \times 10^{-12}$ farads), then to achieve a 0.1 microsecond data transfer time, a gap resistance of approximately $10^5$ Ohms is required. Gap resistances of $10^5$ Ohms in a tunneling mode require that the read/write tip must be no greater than 10Å from the storage medium. By contrast, in the Schottky emission mode, gap distances as large as 500Å are achievable while maintaining a $10^5$ Ohm gap resistance. Thus, in the present invention, the read/write probe may be placed a distance approximately 2 orders of magnitude greater than the surface roughness of the storage medium away and still maintain gap resistances which allow for rapid readout.

Figure 6:
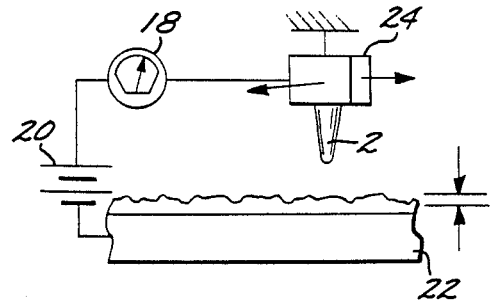
FIG. 6 is an illustration of the relationship between the probe of the present invention and an underlying memory surface with typical roughness as fabricated.

FIG. 6 illustrates a probe 2 and a storage medium 22 of the present invention. As illustrated schematically in this view, ammeter 18 measures the current flowing between probe 2 and memory medium 22 in the presence of a constant voltage from voltage source 20. Read/write head 24 is only driven with two degrees of freedom in a plane parallel to the memory medium, since it is unnecessary to accurately track the surface roughness of the memory medium in order to maintain a sufficiently accurate readout when operating in the Schottky or Field emission modes.

Figure 7:
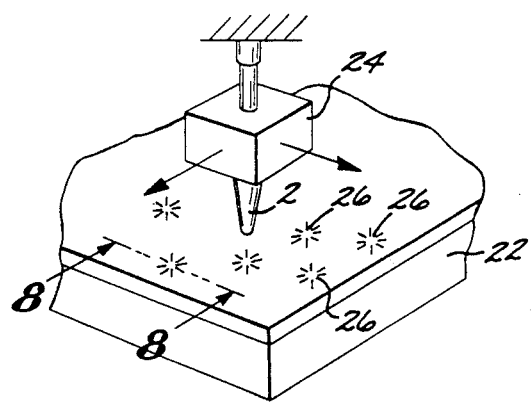
FIG. 7 is a perspective illustration of a probe and memory surface according to the present invention illustrating the placement of binary data in the memory.

FIG. 7 is a perspective view of read/write head 24 carrying read/write probe 2 over memory medium 22 when data have been written into the memory in the form of perturbations 26 representing ones, or an indication of a positive binary state, in the digital format. As illustrated, read/write head 24 is movable in a plane parallel to the surface of memory medium 22.

Figure 8:
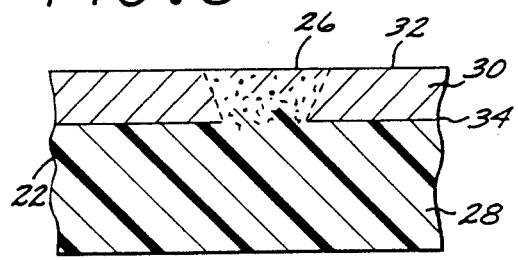
FIG. 8 is an illustration at 88 of FIG. 7, showing the modification of the surface to indicate a positive binary state in the memory.

FIG. 8 illustrates the mechanism by which information is stored in the memory medium 22. Memory medium 22 is constructed of an underlying substrate 28 made of silicon or other suitable semi-conductor. And an overlay 30, typically of a dissimilar transition metal such as platinum, gold or paladium, is deposited on substrate 28. When a probe is moved close to surface 32 of overlay 30, and a pulse of approximately 0.1 to 10.0 volt is applied across the gap, a local perturbation of the interface 4 is caused and material from the underlying substrate 28 migrates into and through overlay 30 to cause an area of local altered resistance. When a constant voltage is applied between memory medium 22 and the probe, this locally altered area causes a change in the current flowing across the gap. Thus, in the present mass storage medium a bit is recorded by physically-chemically altering a small area of the surface, thereby causing a change in the electrical properties of the surface. The change in surface characteristic is initiated as described above when large electrical Fields and current densities are instituted between a probe and an underlying surface.

Figure 9:
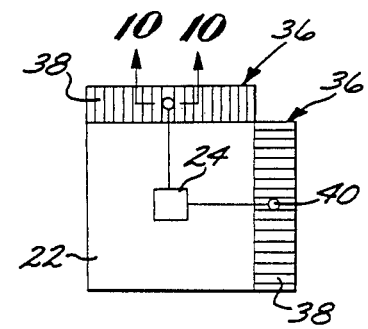
FIG. 9 is a plan elevation view illustrating the arrangement of an indexing means on orthogonal axes of the memory medium.

FIG. 9 illustrates a top view of the read/write head 24 and the orthogonal position encoders 36 of the present invention. In practice encoders 36 consist of gratings 38 alternating conductive and nonconductive strips, over which readout heads 40 move. Readout heads 40 are directly connected to the read/write head 24 and therefore provide the XY position of read/write head 24 with respect to the memory surface 22. While the translation system of the present invention is described in the context of an X-Y reference system, those skilled in the art will recognize that other reference systems, such as angle-distance, may be used to locate data on the memory material.

Figure 10:
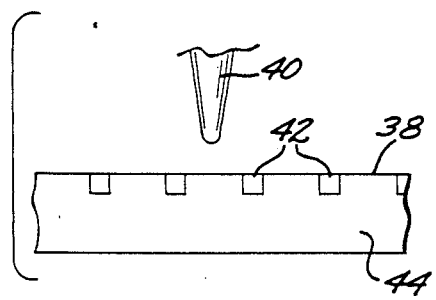
FIG. 10 is a side view, at 10 10 of FIG. 9, illustrating the structure of the gratings and tip for the position encoder of the present invention.

FIG. 10 illustrates the relationship of read/write head 40 over grating 38, showing the alternating conductive areas 42 formed in nonconductive material 44 forming the basic structure of grating 38. As read/out head 40 is moved over grating 38 a variation in resistance is encountered as conductive strips 42 are passed and this information, entered into a counter, yields the position of the readout head 40 and thus the read/write head 42 in both X and Y dimensions of the memory surface.

Figure 11:
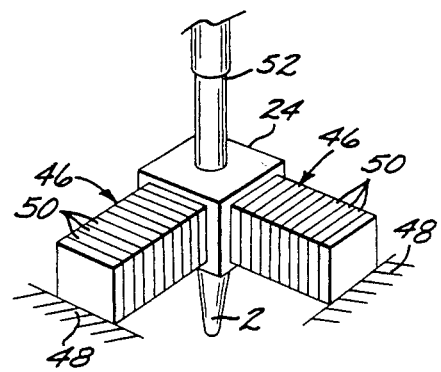
FIG. 11 is an illustration of the piezoelectric horizontal drives of the readout head of the present invention.

FIG. 11 is an illustration of the horizontal orthogonal drives for the read/write head 24. Read/write head 24 is driven, for example, by piezoelectric ceramic stacks 46 situated orthogonally to one another mounted on structure 48. Piezoceramic stacks 46 may be formed of individual piezoelectric ceramic materials 50. Each stack material may be capable of a movement of 0.5 micron in the presence of one volt and thus, a stack of one hundred such piezoceramics will provide movement of 50 microns for one volt applied to each piezoceramic. Thus the piezoceramic stack provides a means of moving read/write head 24 both relatively large distances and small distances with high accuracy by selectively activating the piezoelectric materials in such a stack and/or varying the voltage applied to the elements of the stack. A capacitive drive 52 may be provided in the vertical direction to slightly alter the distance of read/write 2 from memory surface 22 to compensate for alterations in the flatness of the memory surface with changes in temperature or other physical disturbances, but it is unnecessary in the present invention to exactly follow the detailed contour of the surface vertically in order to perform readout of information stored on the surface.

FIG. 12 illustrates in a schematic fashion the electromechanical feedback system required for the vertical axis if it were desirable to maintain a fixed distance between a probing tip and an underlying memory surface. As shown in the diagram a voltage is output from the I/V converter 52 which is proportional to the tip-to-surface current. The output from the I/V converter 52 is then compared with a reference voltage from voltage source 54 and the difference is integrated 58 after passing through comparator 56. Thus, voltage $V_P$ yields a direct indication of the surface contour, since variation in $V_P$ track variation in the transducer 60 movement required to maintain a fixed tip-to-surface distance.

The present invention eliminates the need to provide such an electromechanical feedback system for the purpose of reading out data stored on the surface of the memory medium. FIG. 13 illustrates the mechanisms of the present invention as the tip T is scanned over a local disturbance in a storage medium showing the variation in voltage $V_P$ as the tip is driven to maintain a constant apparent current between the tip and storage medium thereby directing the perturbation of the disturbance representing the stored bit.

FIG. 14 illustrates the mechanism of the present invention in which the tip T is passed over an area containing a bit, with the tip scanned at a constant distance from the storage medium, utilizing Schottky or Field effect emission between the storage medium and the tip. As shown in FIG. 14, since there is no error voltage utilized to drive the tip relative to the plane of the storage medium, the output is represented as a change in current $I_g$ read between the storage media and the tip. Thus, scanning a probing tip at high speeds over a flat surface that has local changes in electronic properties can be achieved by reducing the frequency response of the integrator driving the vertical transducer and reading the changes in the tip-to-surface current. Thus, the use of the technique of the present invention for reading of information results in dramatic increases in the speed with which the tip may be scanned over the surface and a tremendous relaxation of the performance requirements of the vertical tip scanning system, requiring only that the vertical tip scanning system react to gradual changes in the slope of the plane of the memory medium.

Figure 15:
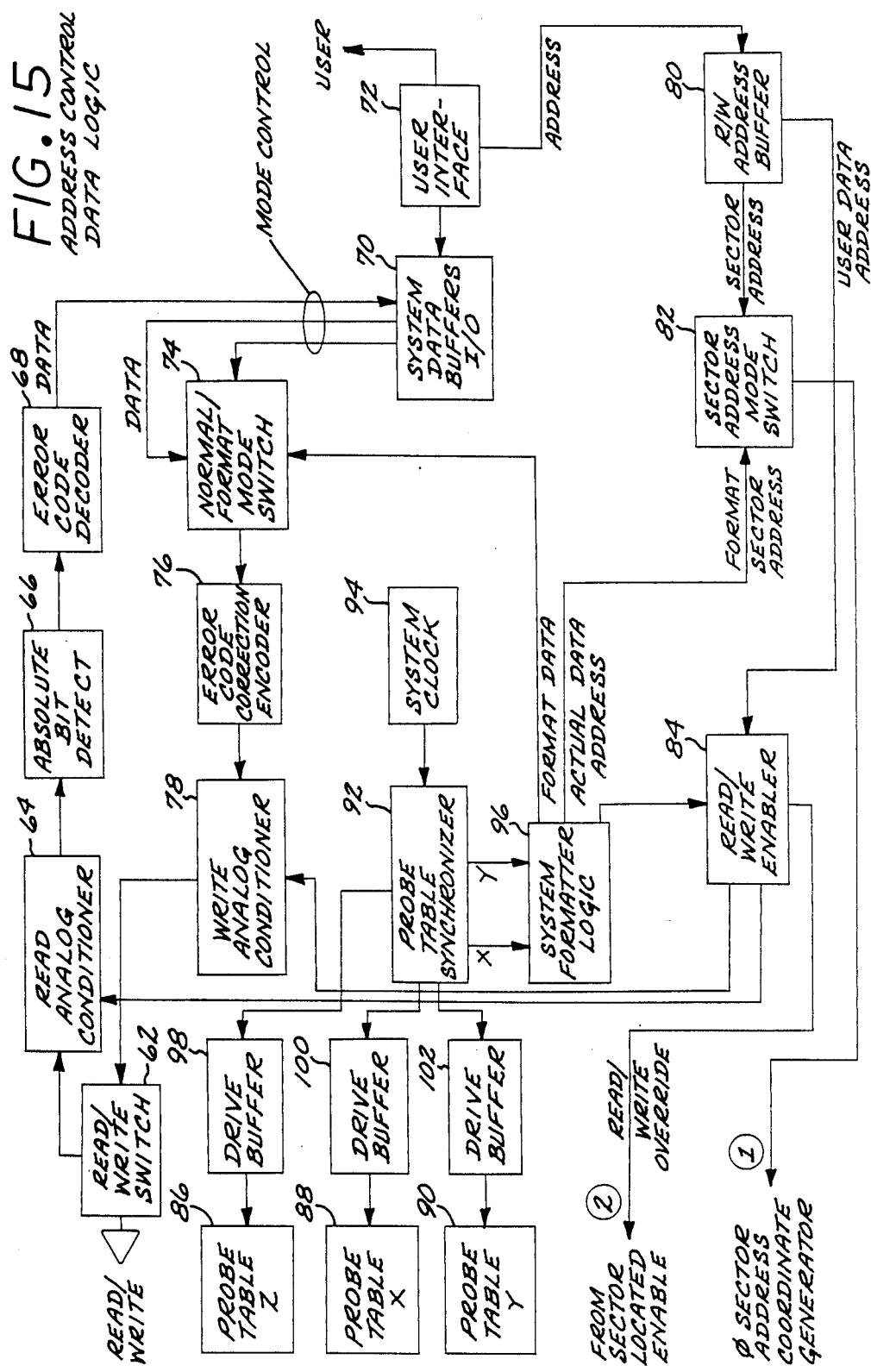
FIG. 15 is a schematic diagram of the address control and data logic of the present invention.

FIG. 15 is a schematic diagram of the address control and data logic for the present invention. Read/write probe 2 is connected to a read/write switch 62 which allows a change between the read and write portions of the control system. In the read mode, the output of the read/write probe and the read/write switch 62 is fed to read analog conditioner 64, the output of which is detected by absolute bit detector 66 and passed to a error code decoder, of the type well known in the art, from which decoded data are output. This stream of digital data is fed to a system data buffer 70 which may be accessed by a user through interface 72. The user may input data through the user interface 72, and system data buffer 70, into the mode switch 74, to pass through error code encoder 76 and a write analog conditioner 78 before the data is entered into read/write switch 62 for the writing of data via the read/write probe into the memory.

When bits are read or written, an address is supplied via user interface 72 to a read/write address buffer 80 which provides a sector address as an output to the sector address mode switch 82. This information is also forwarded to the read/write enabler 84 which controls the read/write functions. The addresses associated with the XYZ coordinates are provided from probe tables for the Z, X and Y coordinates 86, 88 and 90 respectively, which are driven from probe table synchronizer 92 referenced to system clock 94. Information regarding the X and Y coordinates of the read/write probe are provided to system formatter logic function 96 and to drive buffers 98, 100 and 102 from probe table synchronizer 92. Thus the user may select either the reading or writing of data and the read/write probe will move to read or write data at the address input by the user.

Figure 16:
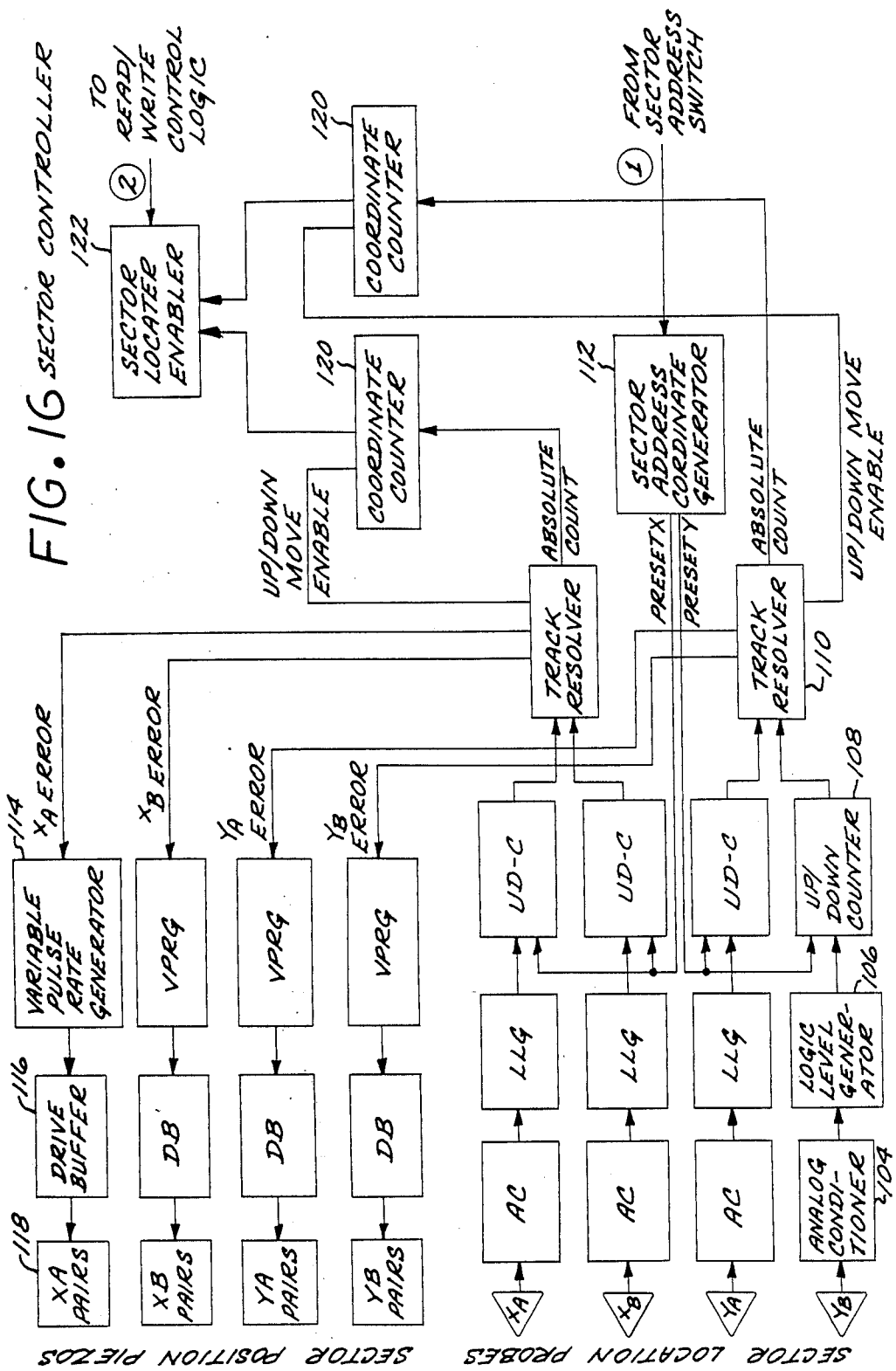
FIG. 16 is a schematic diagram of the sector controller portion of the control system of the present invention.

FIG. 16 is a schematic illustration of a sector controller of the type found to be useful for driving read/write probes to desired locations on the memory surface of the present invention. Sector location read out probes, previously described in FIGS. 9 and 10, provide inputs to analog conditioners 104, logic level generators 106 and up/down counters 108 for resolution into X and Y coordinates by track resolvers 110. The output of track resolvers 110 varies with the sector address coordinator generator 112 and provide error signals to the variable pulse generator 114, drive buffer 116 and piezoelectric pairs 118 to the sector position piezoelectric drivers. The output of track resolvers 110 are then provided to coordinate counters 120 which provide inputs to sector locator enabler 122 and output to the read/write control logic. From the above it may be seen that a precise feedback system to position the read/write probe over the memory surface may be achieved without directly utilizing the information on the storage medium, thus providing important benefits in redundancy and accuracy compared with an approach which relies on the information on the memory medium itself.

From the above it will be seen that the present invention provides a substantial improvement in mass storage systems that are to be used in demanding applications and achieves a high data density without high complexity or delicate construction. Furthermore, the invention provides a means of rapidly accessing data and determining the location of the read/write probe independent of the stored data.

While a particular form of the invention has been illustrated and described, it will also be apparent to those skilled in the art that various modifications can be made without departing from the spirit and scope of the invention. Accordingly, it is not intended that the invention be limited except as by the appended claims.

We claim:

1. A random access memory which comprises:
   a memory medium, said memory medium including a portion of said medium which is formed to be essentially planar;
   an underlying structure, said structure providing means to mount said memory medium and other elements of said random access memory in a fixed relationship to one another;
   a probe, said probe capable of movement in a plane parallel to said planar portion of said memory medium, said probe spaced apart from said medium a distance such that the variations in surface smoothness of said planar portion are small compared to the distance between said probe and said planar portion;
   means to move said probe parallel to said planar portion of said memory medium to a predetermined location over said memory medium on the basis of an input related to said predetermined location;
   means to locate the actual position of said probe relative to a fixed location on said planar portion of said memory medium; and
   means to determine the binary logic state of a location on said memory medium on the basis of emissions caused when a voltage differential from a power source is applied between said probe and said medium and the gap between said probe and said medium is maintained between 20 and 1000 angstroms to effect either Schottky and/or Field emissions between said probe and said memory medium.

2. The random access memory of claim 1 wherein said means to move said probe parallel to said planar portion of said memory medium further comprises a plurality of electromechanical elements arranged parallel to the plane in which it is desired that said probe move, and
   means to activate said electromechanical elements such that a given control signal produces a predetermined movement of said probe.

3. The random access memory of claim 2 wherein said electromechanical elements further comprise piezoelectric elements.

4. The random access memory of claim 1 wherein said memory medium further comprises:
   a top layer of conductive material formed on an underlying substrate, said substrate composed of a dissimilar material to said layer of conductive material, said substrate having a conductive resistance different from that of said conductive layer.

5. The random access memory of claim 4 wherein said top layer of conductive material further comprises an element or alloy including a member of the transition group of metals.

6. The random access memory of claim 4 wherein said top layer of conductive material further comprises an element or alloy including a member of the group of post transition metals.

7. The random access memory of claim 4 wherein said top layer of conductive material further comprises an element or alloy including a member of the group of lanthanide series of elements.

8. The random access memory of claim 4 wherein said top layer of conductive material further comprises an element or alloy including a member of the group of actinide series of elements.

9. The random access memory of claim 4 wherein said substrate is formed of a crystaline structural material.

10. The random access memory of claim 1 wherein said readout probe further comprises a tip having a free end with an area not exceeding $10^8$ square angstroms.

11. The random access memory of claim 1 wherein said means to accurately locate the actual position of said probe further comprises:
    a plurality of gratings consisting of strips of alternating materials arranged parallel to orthogonal axes of said memory medium;
    means to sense the movement of said probe in a plane parallel to said gratings; and
    means to read out the location of said probe based upon the sensing of the passage of said probe relative to said gratings.

12. The random access memory of claim 11 wherein said means to read out the location of said probe further comprises:
    means to count the passage of said strips and thereby determine the distance traveled by said probe.

13. The random access memory of claim 1 wherein said means to determine the logic state of a location on said memory medium comprises:
    current measurement means connected between said probe and said power source.

14. A memory system for use with a computer that comprises:
    a memory material, including a substrate of electrically conductive material having at least one planar surface with a layer of dissimilar conductive material formed on said planar surface and forming a parallel planar surface thereabove;
    an electrically conductive probe spaced above said surface, said probe capable of movement in a plane parallel to said planar surface, whereby the free tip of said probe moves above said planar surface at a distance sufficient to cause Schottky emissions and/or Field emissions between said memory material and said probe when a voltage differential is applied between them;
    means to move said probe to a desired position over said memory material plane or surface on a basis of a remote command; and
    means to independently locate the position of said probe relative to a known position on said planar surface;
    whereby disturbances in the continuity of said memory material may be determined on the basis of changes in current experienced between said probe and said memory material.

15. The memory system of claim 14 wherein said means to move said probe parallel to said planar portion of said memory medium further comprises a plurality of electromechanical elements arranged parallel to the plane in which it is desired that said probe move, and
    means to activate said electromechanical elements such that a given control signal produces a predetermined movement of said probe.

16. The random access memory of claim 15 wherein said electromechanical elements further comprise piezoelectric elements.

17. The memory system of claim 14 wherein said top layer of conductive material further comprises an element or alloy including a member of the transition group of metals.

18. The memory system of claim 14 wherein said top layer of conductive material further comprises an element or alloy including a member of the group of post transition metals.

19. The memory system of claim 14 wherein said top layer of conductive material further comprises an element or alloy including a member of the group of lanthanide series of elements.

20. The memory system of claim 14 wherein said top layer of conductive material further comprises an element or alloy including a member of the group of actinide series of elements.

21. The memory system of claim 14 wherein said substrate is formed of a crystaline structural material.

22. The memory system of claim 14 wherein said readout probe further comprises a plurality of probes mounted on a common carrier.

23. The memory system of claim 14 wherein said means to locate the actual position of said probe further comprises:
    a plurality of gratings consisting of strips of alternating materials arranged parallel to orthogonal axes of said memory medium;
    means to sense the movement of said probe in a plane parallel to said gratings; and
    means to read out the location of said probe based upon the sensing of the movement of said probe relative to said gratings.

24. The memory system of claim 23 wherein said means to read out the location of said probe further comprises:
    counter means operational to count the passage of said strips and thereby determine the distance traveled by said probe.

25. The memory system of claim 14 wherein said means to determine the logic state of a location on said memory medium comprises:
    current measurement means connected between said probe and said memory material.

26. A data storage system which comprises:
    at least one probe, said probe further comprising a conductive surface at its free end of less than $10^8$ square angstroms;
    a layered storage medium, said storage medium further comprising parallel layers of dissimilar materials;
    means to move said probe parallel to a surface plane referenced to the layers of said storage medium;
    means to index and locate the position of said probe relative to a chosen position on the surface of said storage medium;
    means to selectively perturb a predetermined portion of said storage medium to thereby place an indication of logic state on said portion of said medium; and
    means to derive the logic state of a selected portion of said storage medium based upon the emissions present when the tip of said probe is placed between 20 angstroms and 1000 angstroms away from said surface of said medium to effect either Schottky and/or Field emissions between said probe and said medium.

27. The data storage system of claim 26 wherein said means to move said probe parallel to said planar portion of said memory medium further comprises a plurality of piezoelectric elements arranged parallel to the plane in which it is desired that said probe move, and
    means to activate said piezoelectric elements such that a given control signal produces a predetermined movement of said probe.

28. The data storage system of claim 26 wherein said storage medium further comprises:
    a top layer of conductive material formed on an underlying substrate, said substrate composed of a material dissimilar to said top layer of conductive material.

29. The data storage system of claim 26 wherein said means to index and locate the position of said probe relative to a chosen position on the surface of said storage medium further comprises:
    a plurality of gratings consisting of strips of alternating dissimilar materials arranged parallel to orthogonal axis of said storage medium;
    means to sense the passage of said probe in a plane parallel to said gratings; and
    means to read out the location of said probe based upon the sensing of the passage of said probe relative to said gratings.

30. The data storage system of claim 29 wherein said gratings are located on said storage medium.

31. The data storage system of claim 29 wherein said means to sense the passage of said probe in a plane parallel to said gratings comprises a sensor capable of detecting the passage of said strips of alternating materials in said gratings.

32. The data storage system of claim 29 wherein said gratings and said sensors are arranged to provide an indication of angle distance movement.

33. The data storage system of claim 31 wherein said means to read out the location of said probe further comprises:
    counter means operational to count the indication of the passage of said strips past said sensor and thereby determine the distance traveled by said sensor.

* * * * *